United States Patent [19]
Wilson et al.

[11] Patent Number: 5,210,486
[45] Date of Patent: May 11, 1993

[54] CIRCUIT TEST METHOD

[75] Inventors: Alice Wilson, Finchampstead, United Kingdom; Benjamin Rogel-Favila, London, England; Antony Wakeling, Ashington, United Kingdom

[73] Assignee: Schlumberger Technologies Limited, Farnborough, England

[21] Appl. No.: 755,673

[22] Filed: Sep. 6, 1991

[30] Foreign Application Priority Data

Sep. 7, 1990 [GB] United Kingdom ............... 9019614
Apr. 9, 1991 [GB] United Kingdom ............... 9107484

[51] Int. Cl.⁵ ........................................... G01R 31/28
[52] U.S. Cl. ............................. 324/158 R; 324/73.1; 324/537; 371/15.1; 371/22.1
[58] Field of Search .............. 324/158 R, 73.1, 537; 371/15.1, 22.6, 24, 25.1, 26, 22.1

[56] References Cited

U.S. PATENT DOCUMENTS

| | | | |
|---|---|---|---|
| 4,709,366 | 11/1987 | Scott et al. | 371/22.6 |
| 4,847,795 | 7/1989 | Baker et al. | 371/26 |
| 4,964,125 | 10/1990 | Kim | 371/15.1 |

FOREIGN PATENT DOCUMENTS

WO9100527 7/1989 PCT Int'l Appl.

OTHER PUBLICATIONS

Abromovici, Breuer & Friedman, "Digital System Testing and Testable Design" ISBN-0-7167-8179-4, pp. 549-554.

Crane, M., "State of the Art in Functional Board Diagnostics Software" Test 90 Conference Proceedings ISBN 1-870208-19-6.

'Fault Diagnosis Assistant' by Edward Purcell, IEEE Circuits and Devices magazine, vol. 4, No. 1, Jan. 1, 1988, pp. 47-59.

de Kleer and Williams, 'Diagnosing Multiple Faults' "Artifical Intelligence Journal", vol. 32, 1987, pp. 97-130.

Reiter, Raymond, A theory of Diagnosis from First Principles' Artificial Intelligence, vol. 24, 1984, pp. 57-95.

A. McKeon, A Wakeling, 'Fault Diagnosis in Analogue Circuits Using AI Techniques', International Test Conference Proceedings, 1989, pp. 118-123.

McKeon, A. Wakeling A. J., 'Model Based Analogue Circuit Fault Diagnosis' Test 90 Conference Proceedings, Apr. 1990, pp. 1-14.

McKeon A. Wakeling A. J. 'The Location of Faults in Analogue And Mixed-Signal Circuits', Test The Exhibition '90 Conference Proceedings, Oct. 1990.

R. Davis, 'Diagnostic Reasoning Based on Structure Behavior', Artifical Intelligence, vol. 22, 1984, pp. 347-410.

E. Rogel-Favila, P. Y. K. Cheung, 'Circuit Representation and Diagnosis Using Prolog', IEEE Symposium on Circuits and Systems, Apr. 1989.

B. Rogel-Favila, A. J. Wakeling, P. Y. K. Cheung: 'On the Acceleration of digital circuit Fault Diagnosis', Test 90 Conference Proceedings, Apr. 1990, pp. 15-27.

*Primary Examiner*—Ernest F. Karlsen
*Attorney, Agent, or Firm*—Robert F. O'Connell

[57] ABSTRACT

The present invention relates to a method of testing of digital and analog circuits. If a fault is detected, after stimuli are applied and test measurements are made at some circuit nodes, steps are taken to locate faulty circuit components. At least one further node is selected for measurement on the basis of the levels of information that such nodes can provide. Further measurements aid fault location.

For analog circuits, levels of information are determined by calculation of discrimination factors which depend on possible voltage ranges at unmeasured circuit nodes if various components are considered as faulty. The information gained from measurement at a further node is used to reduce the voltage ranges in order to aid selection of another node to measure.

12 Claims, 3 Drawing Sheets

CIRCUIT TEST METHOD

The present invention relates in general to a method for detecting and locating faults in analog or digital systems from the response of those systems to applied stimuli. It is appropriate to the testing of both sequential and combinational digital circuits.

British patent application GB-A-2226889 discloses a method of analog circuit testing in which a set of stimuli, including supply potentials, is selected for application to the circuit, at first nodes, a set of test measurements is taken from second nodes of the circuit. The circuit is analysed as a network of nodes and modules to derive from the stimuli, measurements and constraints imposed by the modules, at least two differently derived values of a variable at at least some nodes. A fault is detected if differently derived ranges are incompatible.

An analysis cycle which has led to an inconsistency is repeated with the constraints on a selected module being removed, other than the constraint that all the currents into the module sum to zero, and the selected module is treated as potentially faulty if such removal of constraints leads to removal of the inconsistency.

The reader is referred to this document GB-A-2226889 as background to the present invention. This describes a method which involves the selective suspension of constraints imposed by various circuit components in order to locate a fault or faults, provided of course, that a fault is detected. It will be seen that constraints are rules by which circuit modules modify voltage and current values between their inputs and outputs. The suspension or removal of constraints is suspension of these rules, except for the basic current rule that currents into each module sum to zero.

In conventional testing of circuits, a simulator is used to simulate output values from input values. Inconsistencies are found where an output value from the simulator does not agree with that measured. However, such a conventional simulator has great difficulty in converging to an adequate solution where components are found to be missing from the circuit that it is intended to simulate. It is then not able to use measured output values as input values in simulation of some circuit portions.

In testing circuits using conventional methods (not involving suspension of constraints) if a fault is detected, decisions of which nodes of the circuit to probe in order to locate further faults, are made automatically, using one of two approaches. In the first approach, the operator is guided component by component back through the circuit from a faulty output, until the measurements match with those expected. The problem with this is that in the case of a feedback loop he would not find a good value until he has passed right through the loop.

The second approach is to use a binary search in an attempt to reduce the number of nodes that have to be visited. This technique is totally confused by a lack of good values in a feedback loop containing a fault. Unless there is some form of online simulation to verify that the incorrect values measured are mutually consistent with a section of the circuitry, it is not possible to exonerate sections of the circuit in the presence of unexpected values.

A problem addressed by the present invention is to decide which of the circuit nodes which are unmeasured, is or are the best to measure in order to expedite diagnosis, that is the location of faults. Diagnosis is best if the number of modules of a circuit suspected to be faulty (be they components or groups of components) is reduced as quickly and completely as possible.

The present invention provides a method of testing a circuit comprising a measurement routine, wherein a set of stimuli, including supply signals, is selected for application to a circuit, at first nodes thereof, and a set of test measurements is taken from second nodes of the circuit, the measurement routine including an analysis cycle in which the circuit is analysed as a network of nodes and modules to derive from the stimuli, the measurements and constraints of the modules at least two differently derived values at each of a number of nodes, in which a fault is detected if differently derived values are incompatible, and if a fault is found, an analysis cycle which has led to an incompatibility is repeated with the constraints of a selected module suspended, and said selected module is suspected to be faulty if such removal of constraints leads to a removal of the incompatibility, and at least one further node is selected for test measurement to reduce the number of circuit modules which are suspected to be faulty, being the first node or nodes of a set of previously unselected nodes ranked in order of decreasing level of discrimination between suspect modules.

The present invention further provides a method of testing in which an analysis cycle which has led to an incompatibility is repeated a number of times, each time the constraints of a different remaining suspect module being suspended, and said at least one further node is selected.

This invention makes it possible to detect and locate faults in analog or digital circuits using minimal probing. By intelligent systematic selection of circuit nodes to probe within a constraint suspension method of testing as described in GB 2226889, circuit fault diagnosis is expedited.

An embodiment of the invention will now be described, by way of example, with reference to the drawings, in which.

Figure 1:
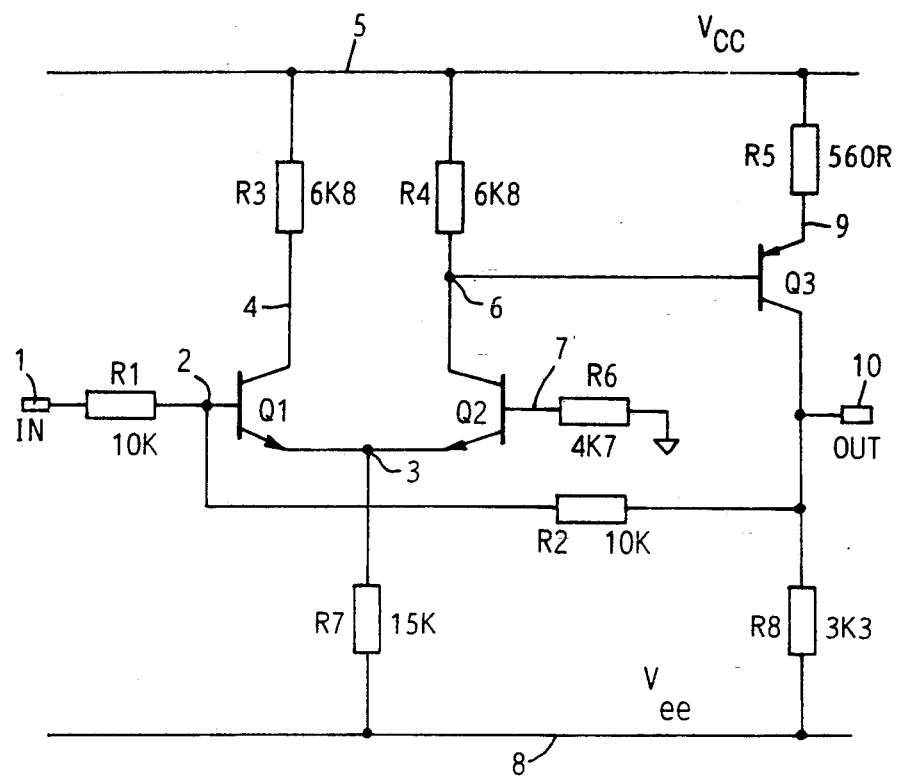
FIG. 1 is an example of an analog circuit for testing (an amplifier circuit)

An example analog circuit for testing is shown in FIG. 1. It consists of three transistors Q1, Q2, Q3, supply rails Vcc, Vee, various resistors R1 to R8 an input, In, and an output, Out. A number of circuit nodes 1 to 10 are shown in FIG. 1 at which stimuli are selectively applied and/or measurements of response made. A fault of transistor Q3 (open circuit) is considered in this example.

The method of testing starts by setting values of all current and voltage ranges to extremes. For example the voltages are set to the maximum and minimum supply rails allowing for tolerances, and the currents to an extreme values such as ±300 Amps. The ranges of the values at nodes are then reduced in accordance with any measurements made, allowing for instrumentation inaccuracies.

The values of the nodes' ranges are then propagated to adjacent nodes through the constraints of the components connected between them. The range calculated for an adjacent node is compared with its previous range. If the two ranges overlap it is deduced that the true value should lie within the range of the overlap. If, on the other hand, there is no overlap, an inconsistency has been discovered.

In a consistent solution, the values calculated for each range can only become as tightly constrained as is possible given the models and measurements that are available. However, it can be assumed, both that the ranges will converge, and that ranges calculated do contain the true value.

An inconsistency implies that measured values cannot be supported by a simulation of a circuit containing only good models. The point at which the inconsistency is discovered does not directly imply that the constraint last used is wrong; only that enough information has been obtained to detect the fault. The next task is to locate the components which could, if they were faulty, explain the measurements that have been taken.

This fault location is achieved by performing the same propagation of ranges through the constraints, except it is performed on a reduced circuit model for each suspect component. In these reduced circuit models the constraints of the suspect component are removed and replaced by a single simple constraint that the current through all its connections must sum to zero. Some of these reduced circuit models turn out to be inconsistent with the measurements proving that their associated component cannot be suspect. Others result in a set of ranges which are consistent with the reduced circuit model.

Figure 2:
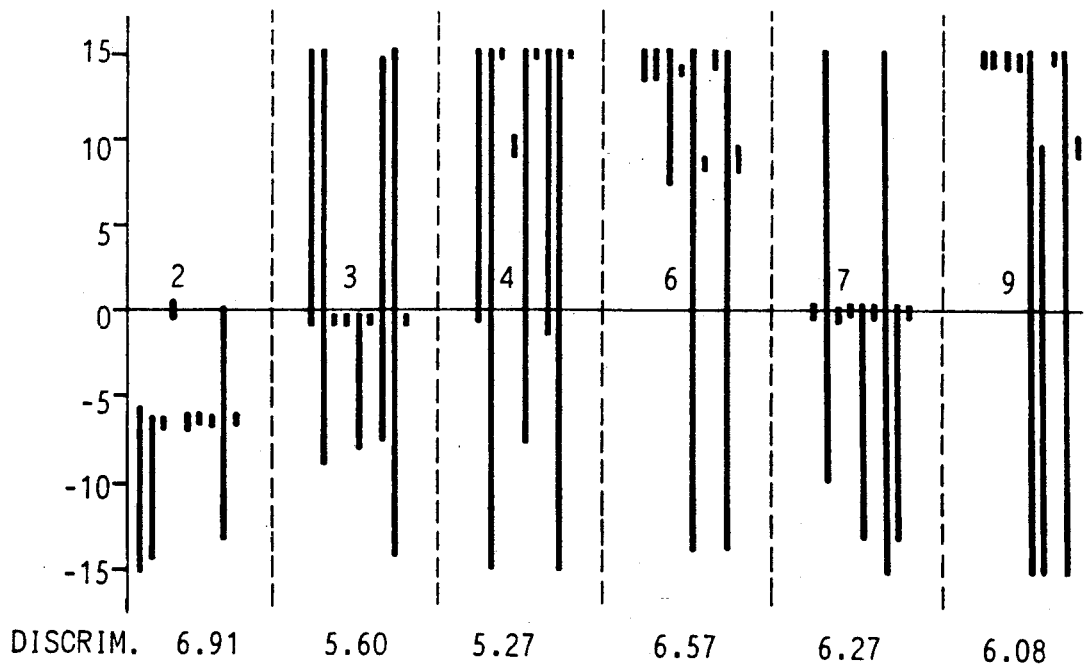
FIG. 2 is a graphical representation of the ranges of values possible at various nodes of the circuit of FIG. 1 with the constraints of various modules removed.

In testing the circuit shown in FIG. 1, after measurements at input and output, the voltage ranges at nodes 2, 3, 4, 6, 7 and 9 are deduced by removal of the constraints of each of nine modules in turn. In this example, the modules are circuit components of transistors and resistors. These voltage ranges are shown in FIG. 2.

From the ranges shown in FIG. 2, node 6 is selected for further measurement as will be described below. A measurement at node 6 is made and the ranges of values are then reduced in accordance with this measurement. The resulting voltage ranges are shown in FIG. 3.

Figure 3:
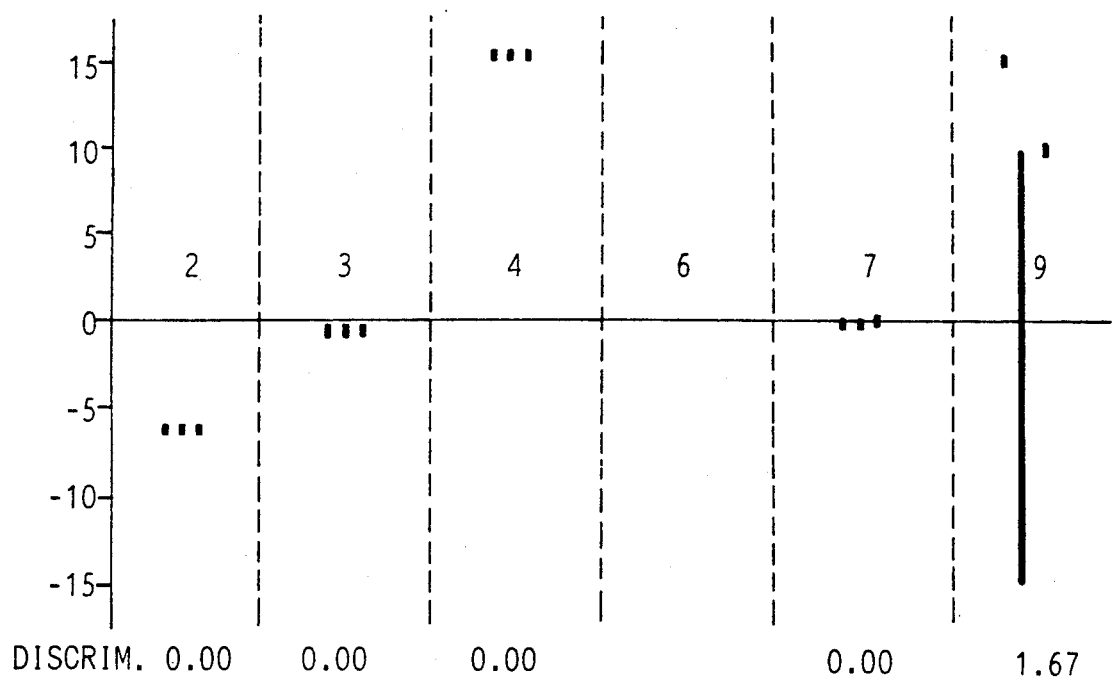
FIG. 3 is a graphical representation of the ranges possible in the circuit of FIG. 1 after additional probing at one node.

From FIG. 3, it can be seen that the number of modules which remain suspect is reduced to three. This is because there are three suspect modules which provide ranges of values at nodes 2, 3, 4, 7 and 9 which are compatible with measurements made.

As nodes 2, 3, 4 and 7 have zero discrimination factor values, measurement at any of these nodes would be consistent with all three suspects. (discrimination factors will be explained below). Accordingly the location of a fault cannot be distinguished further by measurements at any of these nodes. Conversely, node 9 has the highest discrimination factor, and so is selected for measurement. As shown in FIG. 3, if Q3 were the faulty component the measurement would lie between 14.90 and 15 volts; if R5 were the faulty component it would lie between −15 and 9.48; and if R8 were the faulty component between 9.16 and 10.18. There is only a small overlap of these ranges (between 9.16 and 9.48) otherwise if a measurement were made at node 9 it would be sure to resolve to a single suspect. Indeed when the measurement of 15 volts is made at node 9 it proves that the only possible suspect is the transistor Q3.

The discrimination factor quantifies how well a measurement of that node (probe point) would differentiate between present suspects. Although it can be calculated in a variety of ways, it must rank nodes at which measurements have not yet been made according to how well further measurements of these nodes would eliminate suspects.

In this embodiment, the discrimination factors at such nodes are calculated as $$\text{discrimination factor} = \frac{\sum_{i=1}^{n} VR_i \times (n - i)}{V_{TOT}}$$

where
- $i = 1, 2 \ldots n$ where n is the number of previously suspect modules or components,
- $VR_i$ is the net magnitude of a range or ranges of values for which if a measurement at that previously unselected node was taken and found to be within that range there would be i remaining suspect modules,
- $(n - i)$ is the number of suspect which would be exonerated by such a measurement,
- $V_{TOT}$ is the total possible range within which a measurement at that previously unselected node may lie.

Each part of the total voltage range within which one or more of the suspects deduced range lies is considered, and parts of that range for which suspects can be exonerated are determined to calculate the discrimination factor. Consider the ranges shown in FIG. 2 for node 4. If node 4 is measured to be between 14.95 v and 15 v, there are eight suspects which could be consistent (one which would be exonerated). Similarly, if it is between 10.13 v and 14.95 v, five suspects would remain, and four would be exonerated. The discrimination factor is larger for those nodes for which suspects are exonerated over wider portions of the total range.

From inspection of FIG. 3, it can be seen that the ranges of voltage values for the suspects are similar except at node 9. As an alternative to calculation of discrimination factors, node 9 is selectable for measurement on the basis that it has the largest voltage range.

Returning to FIG. 2, which shows ranges of values at modules prior to measurements at node 6. At each node 2, 3, 4, 6, 7 and 9, a discrimination factor is calculated automatically within the test equipment. That node, which is amendable to measurement, with the highest discrimination factor is chosen for measurement of a response.

In FIG. 2, values for discrimination factor at each node are shown. Node 2 has the highest discrimination factor upon measurements at nodes 1 and 10, as shown in that Figure. However, because node 2 is a virtual earth point which is best not probed, node 6, which has the next highest discrimination factor is selected as an additional node to measure.

In testing of analog circuits, stimuli of d., c., a.c., or impulse-response signals may be applied, and appropriate measurements made.

The invention is also applicable to digital circuits. In time-sequential digital circuits, time varying stimuli are applied at some nodes and time dependent output signals are detected at other nodes. From the constraints of components being removed, a series of two dimensional arrays are produced. Each array has a node index across and a time index down. The states of each node (measured or unmeasured) for each time step fill each array. The states may be 1, 0 or unknown (1 or 0) and how an array is filled depends on the constraints of which corresponding components suspect are removed.

Each array has a node pattern for each node. By considering the node patterns of the series of arrays, the best node to include in a subsequent measurement cycle can be selected. If the patterns at a node are different for each suspect component, then measuring at that node will reveal which one of these initial suspects is faulty.

Often, in practice, node patterns are shared by a number of arrays, where each array relates to a different suspect component. To be sure of reducing the number of suspect components most reliably a node for subsequent measurement is best chosen which has node patterns which are shared by a roughly equal number of arrays. For example, if eight suspect components (with 8 corresponding arrays) share three node patterns A, B, C at node j and three node patterns D, E, F at node K with distributions as follows,

| Pattern | Node i | Pattern | Node K |
|---------|--------|---------|--------|
| A       | 3      | D       | 6      |
| B       | 3      | E       | 1      |
| C       | 2      | F       | 1      | then selection of node j for subsequent measurement rather than node K will more certainly reduce the number of suspects. Whilst a circuit is being analysed by constraint suspension, additional circuit nodes may be probed in order to save the overall time required for testing a circuit. A computer simulation of such fault finding is described as an example below.

Figure 4:
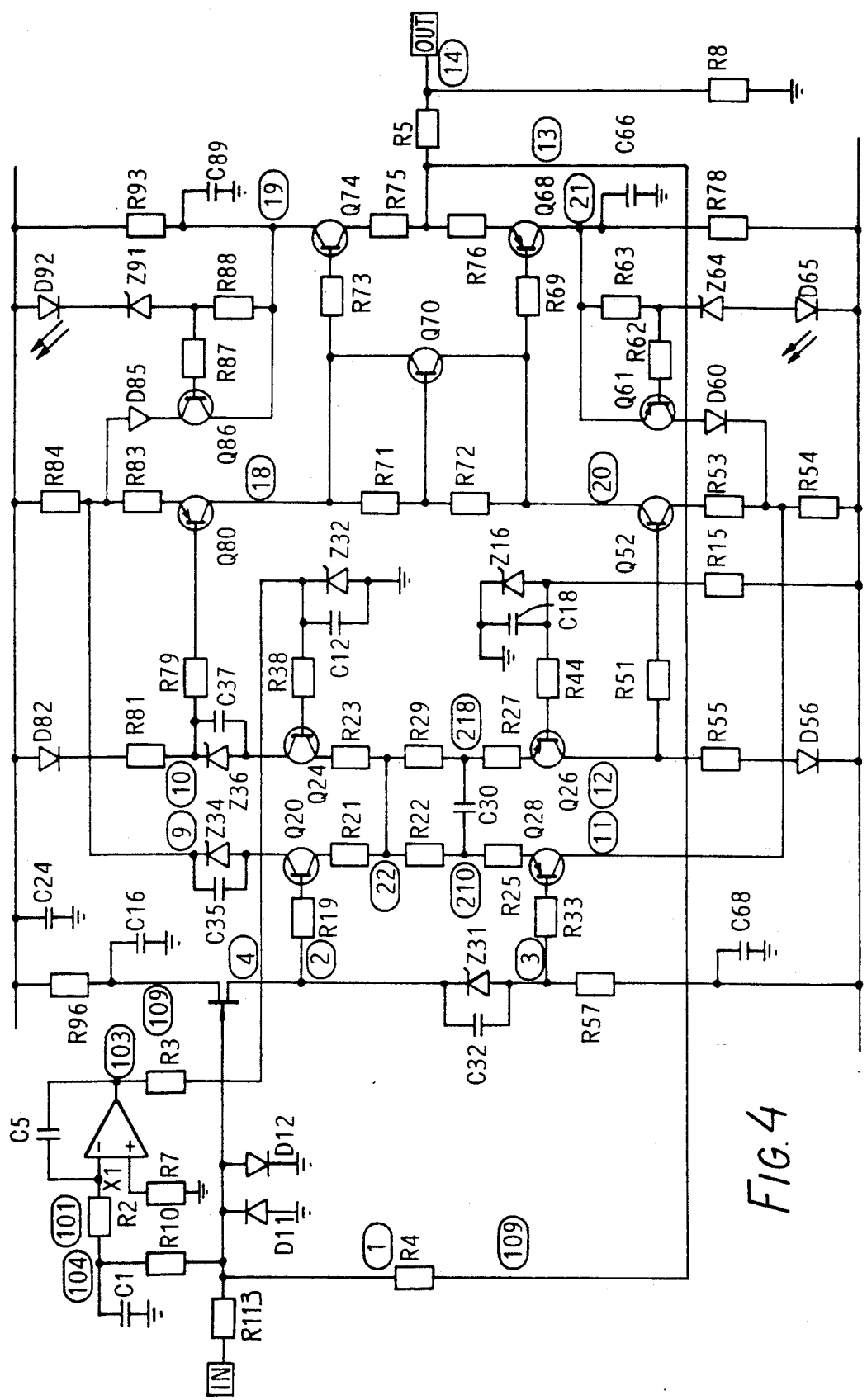
FIG. 4 is a second example of an analog circuit for testing.

The example circuit as simulated is analog, and is shown in FIG. 4. In the simulation, five faults were applied. Five initial measurements were necessary, in a first measurement cycle, to detect an inconsistency in the complete circuit. This inconsistency indicates that there is at least one fault. The method of constraint suspension is used then to locate faults, with additional measurements being made at regular intervals in order to aid this process. The information provided by the further measurements is used to reduce ranges of possible values. The choice of which further node to probe is dependent on the level of discrimination which the nodes for possible further test measurement can provide. The level of discrimination was determined by methods which included a number of strategies, namely
(A) choosing the node with the widest voltage range,
(B) choosing a node near where the inconsistency was first detected,
(C) choosing a node if its discrimination factor (as defined for FIG. 1 discussed above) differentiates between suspects,
(D) choosing a mode with the widest voltage range which connects more than two branches.
The methods are
(1) strategy (A)
(2) strategy (B) else strategy (A)
(3) strategy (C) else strategy (A)
(4) strategy (D) else strategy (A)
(5) strategy (C) else strategy (D)

It is necessary to be able to revert to strategy A for methods 2, 3 and 4 where there are no possible nodes to measure which satisfied their first strategies.

In constraint suspension, the constraints of suspect modules are removed. Nodes surrounded by suspect modules generally have the widest voltage ranges. However, because measuring such nodes would provide little discrimination, in all the strategies, such nodes are avoided for the purposes of further measurement.

In methods 1 and 4, a measurement at a node reduces a range to almost zero, so nodes with a wide range but not surrounded by suspect modules are usefully measured. Also nodes which connect many branches affect larger parts of the circuit and will therefore have greater effect on the convergence of ranges at other nodes, if measured.

With simulated measurements being made at regular intervals and a SUN 3/50 computer being used for simulation and diagnosis, the following results were obtained:

TABLE 1

| Time Interval | Average time for each of the five diagnoses | | | | |
|---|---|---|---|---|---|
| | Method | | | | |
| Seconds | 1 | 2 | 3 | 4 | 5 |
| 30 | 575 | 568 | 525 | 547 | 532 |
| 60 | 702 | 660 | 699 | 669 | 631 |
| 120 | 853 | 762 | 842 | 823 | 833 |
| 240 | 1074 | 1055 | 1187 | 1149 | 1135 |

TABLE 2

| Time Interval | Average number of probes | | | | |
|---|---|---|---|---|---|
| | Method | | | | |
| Seconds | 1 | 2 | 3 | 4 | 5 |
| 30 | 19 | 18 | 17 | 18 | 17 |
| 60 | 11 | 11 | 11 | 11 | 10 |
| 120 | 7 | 6 | 7 | 6 | 6 |
| 240 | 4 | 4 | 4 | 4 | 4 |

TABLE 3

| Time Interval | Number of suspects remaining (Sum of five diagnoses) | | | | |
|---|---|---|---|---|---|
| | Method | | | | |
| Seconds | 1 | 2 | 3 | 4 | 5 |
| 30 | 9 | 9 | 8 | 13 | 8 |
| 60 | 9 | 10 | 8 | 13 | 8 |
| 120 | 12 | 12 | 8 | 15 | 8 |
| 240 | 21 | 13 | 8 | 17 | 8 |

Each diagnosis stopped when the ranges at the nodes ceased to be reduced any further with the information available. The results indicate that methods which include method 3 are necessary to ensure the fewest number of remaining suspects and that method 5 gives the fewest number of remaining suspects in the quickest time.

In the present invention, good nodes to measure are selected. Methods 3 and 5 above reduce the number of suspect modules for five faults to eight. Without such selection, in the present example circuit shown in FIG. 4, 16 probe points might be used.

There are 20 suspects when the measurements were taken at a standard 16 points, and indicates that 9 intelligently placed probes (as used in the 240 second time interval example) can give as much information as the greater number of less well selected ones.

It is difficult to predict the number of probes that would be necessary if conventional backtracking from the failing output were employed. This is because of the multiple paths and feedback loops in the circuit. However, it is likely to be in the order of 20 to 30, and even then a high level of skill would be required of the operator to recognise the cause of the fault.

When all 16 probe points were used the measurements and analysis with a 30 second time interval between measurements took 690 secs (360 seconds+(11×30) seconds for probing the 11 further nodes). This compared with 530 seconds for measurements during diagnosis according to method 5, i.e. a saving of approximately three minutes. If the algorithm was run on a faster processor, less probes would be necessary to achieve the same number of remaining suspects. For example if a processor 8 times the speed were used with probes every 30 seconds (the equivalent of every 240 seconds in this example), the diagnoses using the third method would be completed in an average time of 148 seconds with four probes. The average number of probes used can be reduced to four after detection of the faults.

We claim:

1. A method of testing a circuit comprising nodes connected by circuit modules which impose constraints on signal passing between the nodes, each module comprising an electrical component or group of electric components, the method comprising the steps of
    (i) selecting a set of stimuli, including supply signals,
    (ii) applying the set of stimuli at first nodes of said circuits,
    (iii) taking a set of test measurements from second nodes of said circuit,
    (iv) determining, in an analysis cycle, at least two differently derived signal values at each of a number of nodes from the set of stimuli, the set of test measurements, and the constraints on signal values imposed by the modules,
    (v) detecting a fault if the differently derived signal values are incompatible, and
    (vi) if a fault is detected, repeating one or more times, an analysis cycle which has led to an incompatibility, each time with the constraints on signal values imposed by a different selected module being suspended, to determine that a module may be faulty if suspension of the constraints on a selected module that may be faulty leads to a removal of the incompatibility, and
    (vii) taking a further test measurement from at least one further node selected to reduce the number of selected modules which may be faulty in a further analysis cycle said at least one further node being the first node or nodes of a set of previously unselected nodes ranked in order of decreasing level of discrimination between modules which may be faulty.

2. A method according to claim 1, wherein an analysis cycle which has led to an incompatibility is repeated a number of times, each time the constraints of a different remaining suspect module being suspended, and said at least one further node is selected.

3. A method of testing an analog circuit according to claim 1, wherein the derived values are ranges,
    each module suspected to be faulty has at least one associated further node which may be selected, and
    the level of discrimination at a previously unselected second node is related to a discrimination factor calculated for that node.

4. A method of testing an analog circuit according to claim 2, wherein the derived values are ranges,
    each module suspected to be faulty has at least one associated further node which may be selected, and
    the level of discrimination at a previously unselected second node is related to a discrimination factor calculated for that node.

5. A method of testing an analog circuit according to claim 3, wherein
    the discrimination factor is calculated from the ranges determined at that node by the constraints of different selected modules being removed.

6. A method of testing an analog circuit according to claim 4, wherein the discrimination factor is calculated from the ranges determined at that node by the constraints of different selected modules being removed.

7. A method of testing an analog circuit according to claim 3, wherein
    each module suspected to be faulty has one associated previously unselected node, and
    a discrimination factor at each unselected node is calculated as $$\frac{\sum_{i=1}^{n} VR_i \times (n-i)}{V_{TOT}}$$

where
    i=1, 2 ... n where n is the number of previously suspect modules,
    $VR_i$ is the net magnitude of a range of ranges of values for which if a measurement at that previously unselected node was taken and found to be within that range there would be i remaining suspect modules/nodes,
    (n−i) is the number of suspects which would be exonerated by such a measurement,
    $V_{TOT}$ is the total possible range within which a measurement at that previously unselected mode may lie.

8. A method of testing an analog circuit according to claim 3, wherein in repeated measurement or analysis cycles a node at which derived ranges overlap is required to have values of the variable lying within a new range which is the intersection of overlapping ranges.

9. A method of testing a digital circuit according to claim 1, wherein the values are binary states 1, 0 or unknown (1 or 0), and
    in the measurement routine, time varying stimuli are applied, and test measurements made over time, and
    in each analysis cycle, sets of values are derived for each node over time.

10. A method of testing a digital circuit according to claim 2, wherein the values are binary states 1, 0 or unknown (1 or 0), and
    in the measurement routine, time varying stimuli are applied, and test measurements made over time, and
    in each analysis cycle, sets of values are derived for each node over time.

11. A method of testing a digital circuit according to claim 10, wherein if a fault is detected,
    the sets of values derived at a previously unselected second node with the constraints of various modules being removed comprise node patterns, and the further node selected for inclusion in a second measurement cycle is a node for which there are different node patterns.

12. A method of testing a digital circuit according to claim 11, wherein the different node patterns are shared by a roughly equal number of the sets of values derived for that node.

* * * * *